(12) United States Patent
Tendulkar et al.

(10) Patent No.: US 8,847,187 B2
(45) Date of Patent: Sep. 30, 2014

(54) METHOD OF FORMING ANNEAL-RESISTANT EMBEDDED RESISTOR FOR NON-VOLATILE MEMORY APPLICATION

(71) Applicants: Intermolecular Inc., San Jose, CA (US); Kabushiki Kaisha Toshiba, Tokyo (JP); SanDisk 3D LLC, Milpitas, CA (US)

(72) Inventors: Mihir Tendulkar, Mountain View, CA (US); David Chi, Los Altos, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 28 days.

(21) Appl. No.: 13/692,850

(22) Filed: Dec. 3, 2012

(65) Prior Publication Data
US 2014/0151621 A1 Jun. 5, 2014

(51) Int. Cl.
*H01L 29/02* (2006.01)
*H01L 45/00* (2006.01)

(52) U.S. Cl.
CPC ............ *H01L 45/06* (2013.01); *H01L 45/1641* (2013.01)
USPC ..... 257/2; 257/3; 257/4; 257/5; 257/E29.002; 438/102; 438/103; 438/104

(58) Field of Classification Search
USPC .................... 257/1–5, E29.002; 438/102–104
See application file for complete search history.

(56) References Cited

U.S. PATENT DOCUMENTS

| 5,585,776 | A | 12/1996 | Anderson |
| 7,875,871 | B2 * | 1/2011 | Kumar et al. ..................... 257/2 |
| 8,391,049 | B2 | 3/2013 | Jo |
| 2012/0108020 | A1 | 5/2012 | Baldwin |

OTHER PUBLICATIONS

Highly metastable amorphous or nearamorphous ternary films mictamict alloys; Jan. 1, 2001; Z—Book—Elsevier; Microelectronic Engineering 55 2001 357367.
CK Chung et al.; Effect of SiTa and Nitrogen Ratios on the Thermal Stability of TaSiN Thin Films ; ; Elsevier Sequoia.

* cited by examiner

*Primary Examiner* — Jami M Valentine

(57) ABSTRACT

Embodiments of the invention include a nonvolatile memory device that contains nonvolatile resistive random access memory device with improved device performance and lifetime. In some embodiments, nonvolatile resistive random access memory device includes a diode, a metal silicon nitride embedded resistor, and a resistive switching layer disposed between a first electrode layer and a second electrode layer. In some embodiments, the method of forming a resistive random access memory device includes forming a diode, forming a metal silicon nitride embedded resistor, forming a first electrode layer, forming a second electrode layer, and forming a resistive switching layer disposed between the first electrode layer and the second electrode layer.

18 Claims, 8 Drawing Sheets

METHOD OF FORMING ANNEAL-RESISTANT EMBEDDED RESISTOR FOR NON-VOLATILE MEMORY APPLICATION

BACKGROUND OF THE INVENTION

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Current ReRAM devices are generally created in a MIM structure (metal-insulator-metal) using nonvolatile memory as the insulator. It is desirable to construct these devices in a crossbar array structure with each word line and bit line addressed by a driver transistor. As such, the bit at each intersection requires its own leakage-reduction element, such as a diode that serves as a current steering device. The diode only controls passage of current in one direction or the other, but it does not suppress the current. To prevent over-programming of the memory device, an additional resistor may be required at each node.

Manufacturing constraints, however, place limitations on the type of resistor that can be used in nonvolatile memory devices. One significant hurdle for a suitable resistor is the high temperature activation needs of the diode. The resistor must be able to withstand all subsequent memory device processing without significant loss of resistivity or compromising the remaining materials in the memory device, including any high temperature processing of the memory device.

Moreover, as nonvolatile memory device sizes shrink, it is important to have a resistor that can be easily scaled while still providing the same resistance requirements for the memory device. There is a need to provide a resistor that provides current and future resistance requirements, improves device longevity, and suppresses current passing through the memory device so that the memory device can be properly programmed. Therefore, it is desirable to form a nonvolatile memory device that has low programming currents when switching the device between the "on" and "off" states.

SUMMARY OF THE INVENTION

Embodiments of the invention generally relate to a nonvolatile memory device having an embedded resistor and methods of forming the nonvolatile memory device. In some embodiments, nonvolatile resistive random access memory devices include a diode, a metal silicon nitride embedded resistor, and a resistive switching layer disposed between a first electrode layer and a second electrode layer.

In some embodiments, methods of forming a resistive random access memory device include forming a diode, forming a metal silicon nitride embedded resistor, forming a first electrode layer, forming a second electrode layer, and forming a resistive switching layer disposed between the first electrode layer and the second electrode layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

While the foregoing is directed to embodiments of the present invention, other and further embodiments of the invention may be devised without departing from the basic scope thereof, and the scope thereof is determined by the claims that follow.

DETAILED DESCRIPTION

Embodiments generally described herein provide a nonvolatile memory element device having an embedded resistor used in conjunction with a ReRAM device and a diode and methods of forming the same. Embodiments generally provide improved performance and increased usable lifetime of nonvolatile memory devices. It is noted that relative directional terms used herein with regard to embodiments are for purposes of description only, and do not limit the scope of the invention. Specifically, directional terms such as "over," "above," "under," and the like are used under the assumption that substrate on which embodiments are formed is a "bottom" element and is therefore "under" elements of the invention formed thereon.

The diode in a nonvolatile memory device only controls passage of current in one direction or the other, but it does not suppress the current. To prevent over-programming of the memory device due to extraneous current passing through the device, an additional resistor may be required at each node to lower the current levels in the device. The resistor must be able to withstand all subsequent memory device processing without significant loss of resistivity or compromising the remaining materials in the memory device, including any high temperature processing of the memory device. For example, a high temperature anneal electrically activates a diode formed with N+ and P+ dopants. Such high temperature processing, however, tends to be very destructive of materials, often resulting in crystallization of materials. If a resistor subject to such high temperature processing crystallizes, then the resistor tends to become conductive with the resistance dropping well below the specified resistance required by the memory device.

In some embodiments, a nonvolatile resistive random access memory device includes a diode, a metal silicon nitride embedded resistor, and a resistive switching layer disposed between a first electrode layer and a second electrode layer. The electrical properties of the memory device are configured to lower the power required to change the resistive switching layer from a low resistance state (LRS) to a high resistance state (HRS) and vice-versa. It is generally desirable to form the memory device so that its material and electrical properties will not degrade or breakdown during the often high current "burn-in" type device preparation steps, such as the "electrical forming" process, and also during normal repetitive operation of the nonvolatile resistive switching memory device.

Figure 1:
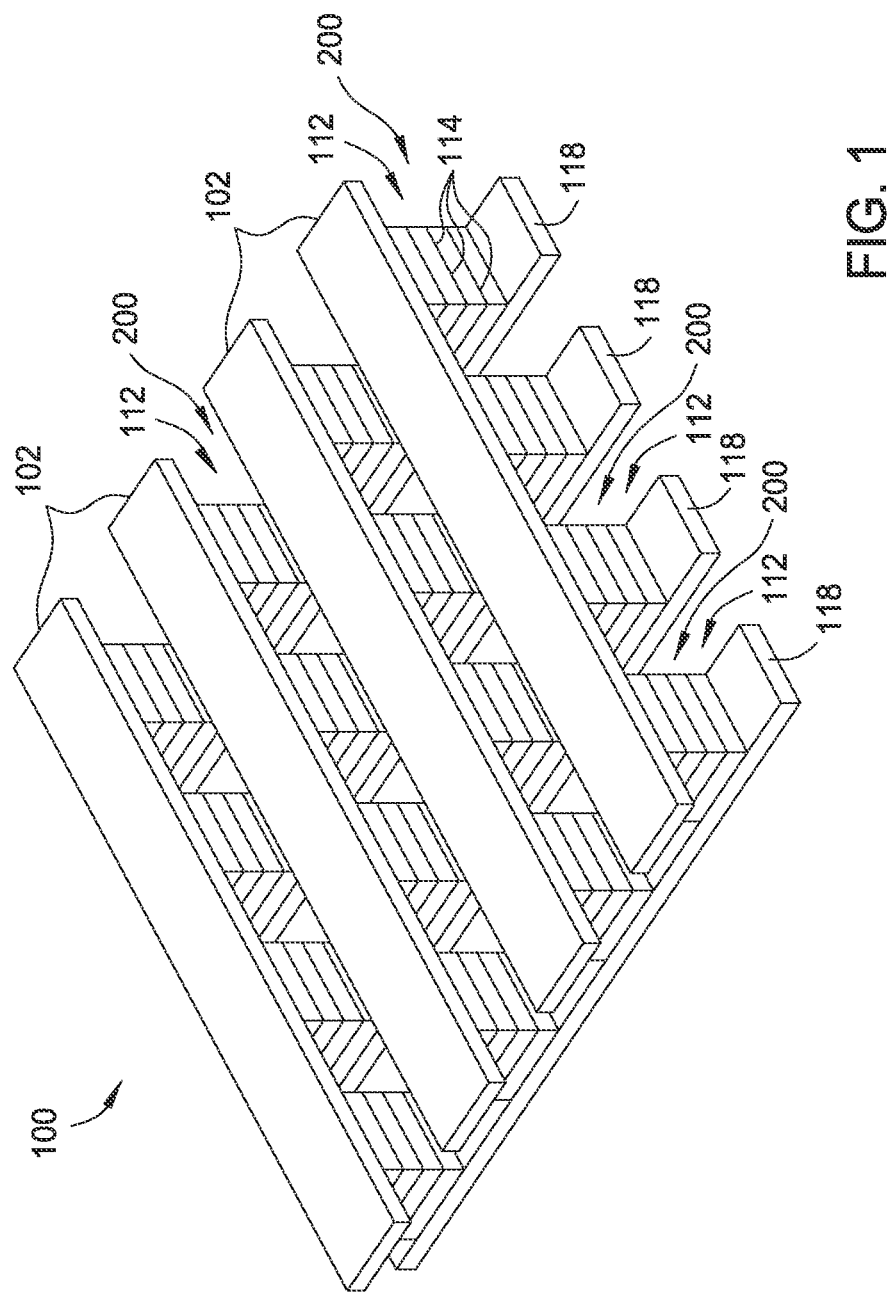
FIG. 1 is a perspective view of a memory array of memory devices, configured according to embodiments of the invention.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, which are referred to herein generally as electrodes 102 and 118, and are used to read from or write data into the memory device 200. Electrodes 102 and 118 generally include one or more conductive layers, each conductive layer having a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figures 2A, 2B:
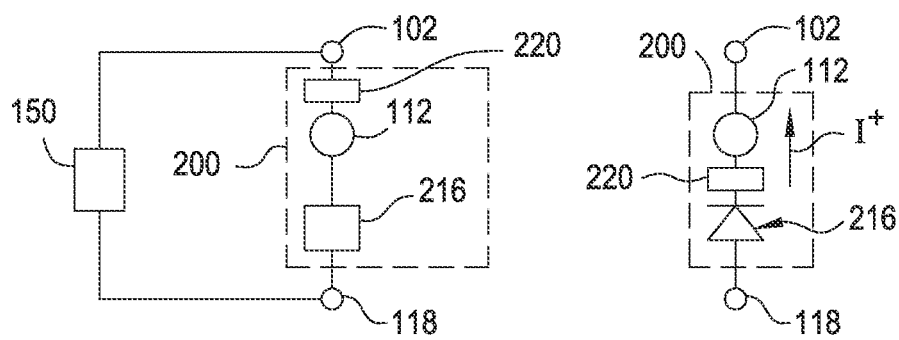
FIG. 2A is a schematic cross-sectional view of a memory device, configured in accordance with some embodiments of the invention.
FIG. 2B schematically illustrates a memory device configured to allow current to flow through the memory device in a forward direction, according to embodiments of the invention.

FIG. 2A schematically illustrates one example of some embodiments of a switching memory device 200 that contains a memory element 112, an embedded resistor 220, and an optional current steering device 216, all of which disposed between the electrodes 102 and 118. In some embodiments, the embedded resistor 220 is incorporated into each of the memory devices 200 to suppress and/or control the current flowing therethrough when a voltage pulse is applied by the read-and-write circuitry 150 during the electrical forming process, read process, write process, set operation, reset operation or other switching operations. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example of some embodiments, the current steering device 216 may include two or more layers of semiconductor material, such as two or more doped silicon layers, that are configured to allow or inhibit the current flow in different directions through the memory element 112 when that memory element is not selected to read.

FIG. 2B schematically illustrates a switching memory device 200 that contains a memory element 112, an embedded resistor 220, and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

Figure 2C:
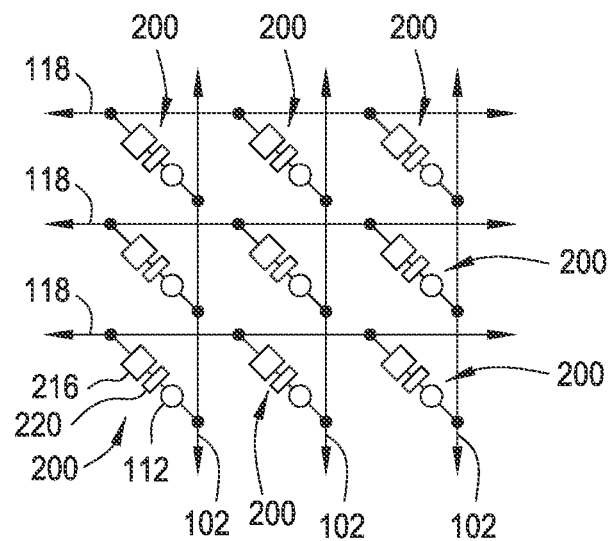
FIG. 2C is schematic representation of an array of memory devices in accordance with some embodiments of the invention.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112, an embedded resistor 220, and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 are formed.

Figure 2D:
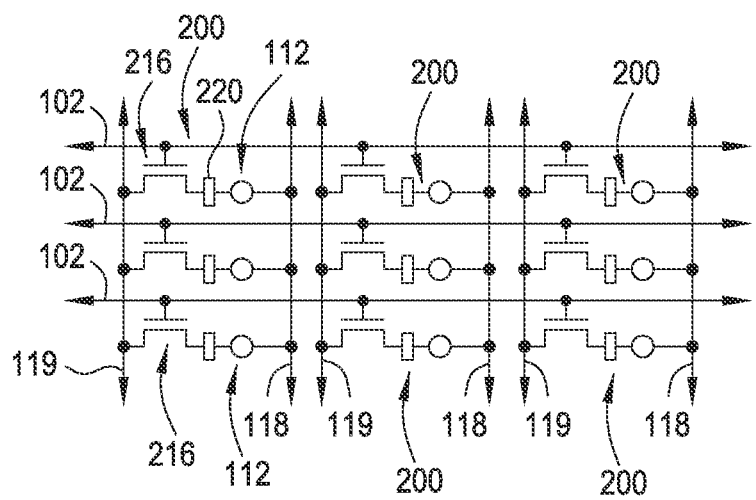
FIG. 2D is schematic representation of an array of memory devices in accordance with some embodiments of the invention.

FIG. 2D schematically illustrates another example of some embodiments of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112, an embedded resistor 220, and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted to provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 are formed.

During operation, such as a read operation, the state of a memory element 112 in the switching memory device 200 can be sensed by applying a sensing voltage (i.e., a "read" voltage $V_{READ}$ (FIG. 3)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

Figure 3:
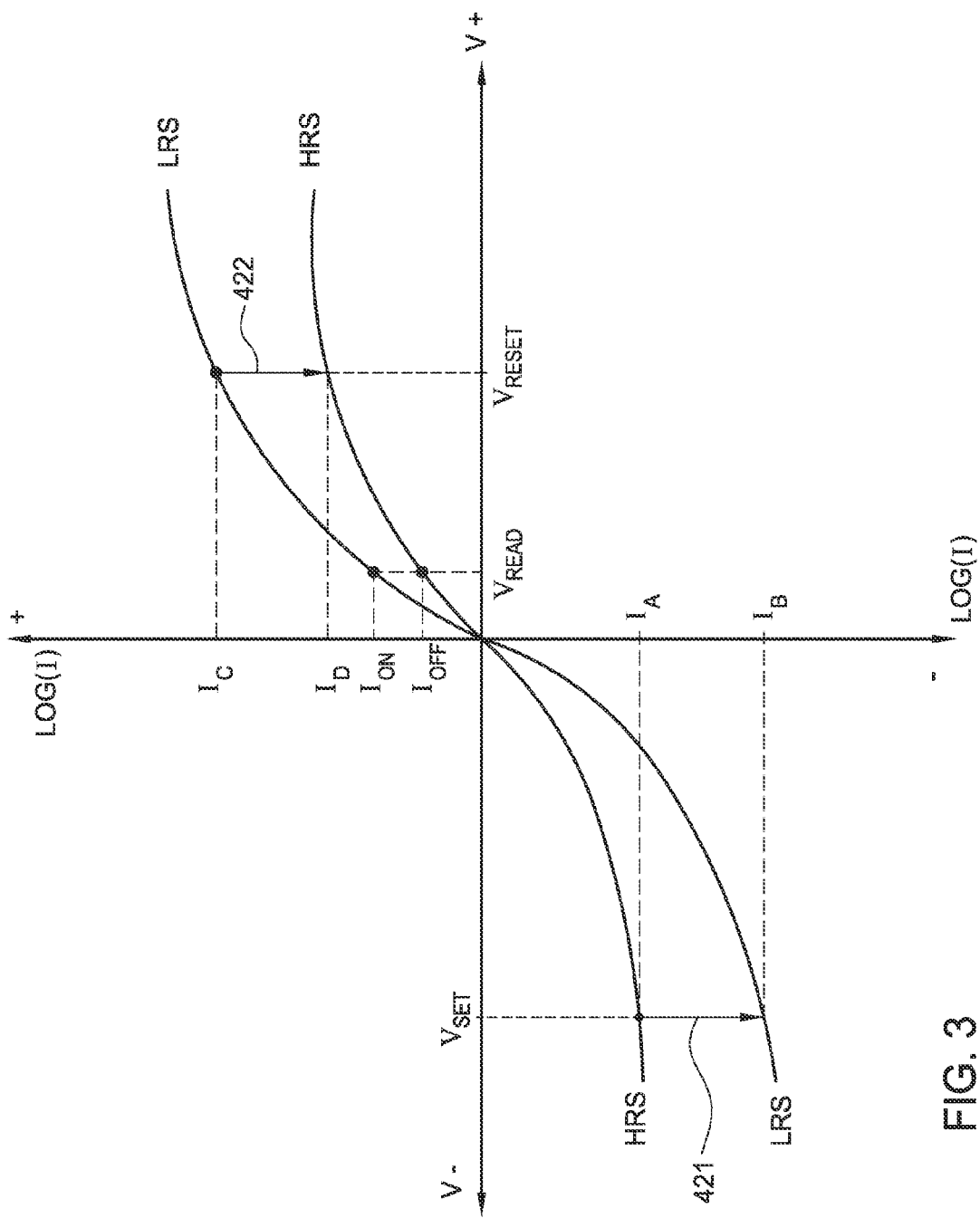
FIG. 3 schematically illustrates exemplary log-log plots of measured current (I) values versus applied voltages (V) of an exemplary embodiment of a memory device having a resistive switching memory element.

In some embodiments, the memory element 112 uses bipolar switching where opposite polarity set and reset voltages are used to alter the resistance of the memory element between high and low resistance states. FIG. 3 schematically illustrates a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 3, illustrate typical threshold values used to "set" and "reset" the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated") or defects in the resistive switching layer 206 (FIG. 4A, 5A, or 5B) of memory element 112 when the memory device 200 is reverse biased.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity, without deviating from the scope of the invention described herein.

Figure 4B:
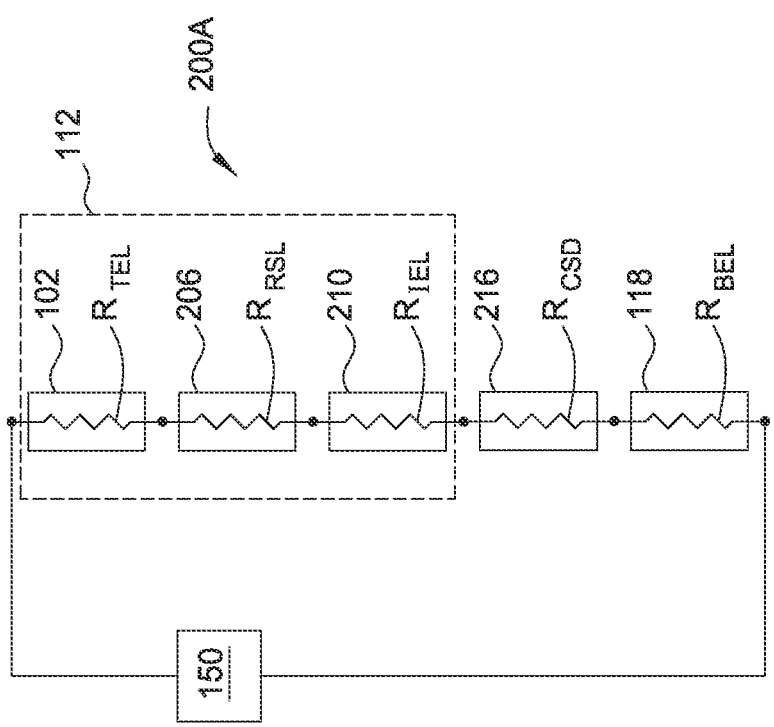
FIG. 4B is a schematic representation of an electrical circuit formed in the standard memory element illustrated in FIG. 4A.
Figure 4A:
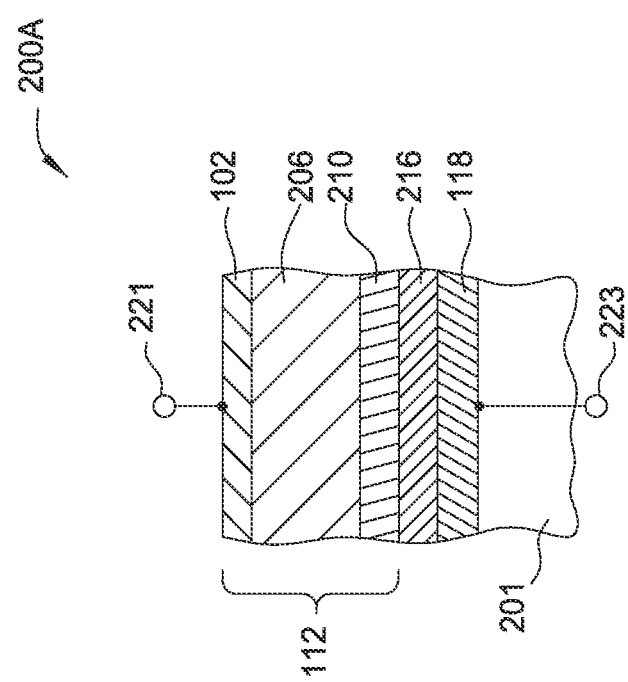
FIG. 4A is a schematic side cross-sectional view of a standard memory element disposed in a nonvolatile memory device.

FIG. 4A is a schematic side cross-sectional view of a standard un-optimized switching memory device 200A, which contains a memory element 112 and a current steering device 216 (e.g., a diode) that is formed over a substrate 201. In this configuration, the memory element 112 generally contains a top electrode 102, resistive switching layer 206 and intermediate electrode 210. FIG. 4B schematically illustrates an electrical circuit formed in the switching memory device 200A shown in FIG. 4A. As illustrated in FIG. 4B, the electrical circuit within the standard switching memory device 200 includes a top electrode impedance (i.e., resistance $R_{TEL}$) created by the material layer(s) in the top electrode 102, a resistive switching layer impedance (i.e., resistance $R_{RSL}$) created by the material layer(s) in the resistive switching layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118. The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The resistive switching layer 206 can be a dielectric material, such as a metal oxide material or other similar material that can be switched between at least two or more stable resistive states. In some embodiments, the high and low resistance states of the resistive switching layer 206 may be about 2.5 MΩ and about 100 kΩ, respectively. One will note that it is assumed that the contact resistances between the various layers in the switching memory device, such as the contact resistance formed between the electrode 102 and the resistive switching layer 206, are negligible to help reduce the complexity of the discussion of the circuit. While the current steering device 216 may include two or more layers of semiconductor material that are adapted to control the flow of current through the formed memory device 200, the resistance of each of the components in the current steering device 216 are not individually discussed herein to minimize the complexity of the discussion, and thus an overall current steering device resistance $R_{CSD}$ is used to represent the overall impedance of the current steering device 216.

Embodiments provide an embedded resistor in order to prevent over-programming of the memory element. Over-programming generally means over-SET, meaning that the device goes into a too low resistance state. The embedded resistor prevents this by shouldering a greater portion of the voltage load as the metal-oxide becomes lower and lower in resistance. The embedded resistor, however, needs to withstand later processing conditions without significant loss in resistivity or compromising the remaining materials in the stack, such as during diode activation which is typically done during high temperature annealing. Additionally, the embedded resistor should provide a constant resistivity over a range of voltages. An embedded resistor comprising a metal silicon nitride according to embodiments may achieve these desired characteristics.

Figure 5A:
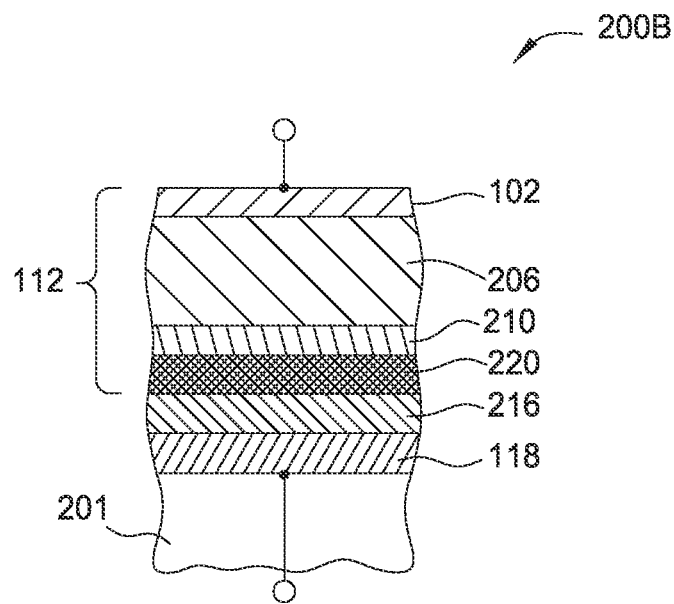
FIG. 5A is a schematic side cross-sectional view of a memory element disposed in a nonvolatile memory device in accordance with some embodiments of the invention.

FIG. 5A is a schematic side cross-sectional view of some embodiments of an improved switching memory device 200B that contains a memory element 112 and a current steering device 216 that are disposed between electrodes 102 and 118 and are formed over a portion of a substrate 201. The switching memory device 200B contains an embedded resistor 220 that is configured to improve the device's switching performance and lifetime. In this configuration, the memory element 112 will generally contain a top electrode 102, a resistive switching layer 206, an optional intermediate electrode 210, or additional conductive layer, and an embedded resistor 220. In some embodiments, the embedded resistor 220 is disposed within the improved switching memory device 200B close to optional intermediate electrode 210 and/or current steering device 216 to prevent over-programming of and reduce leakage through the switching memory device 200B during normal device operation.

Figure 5B:
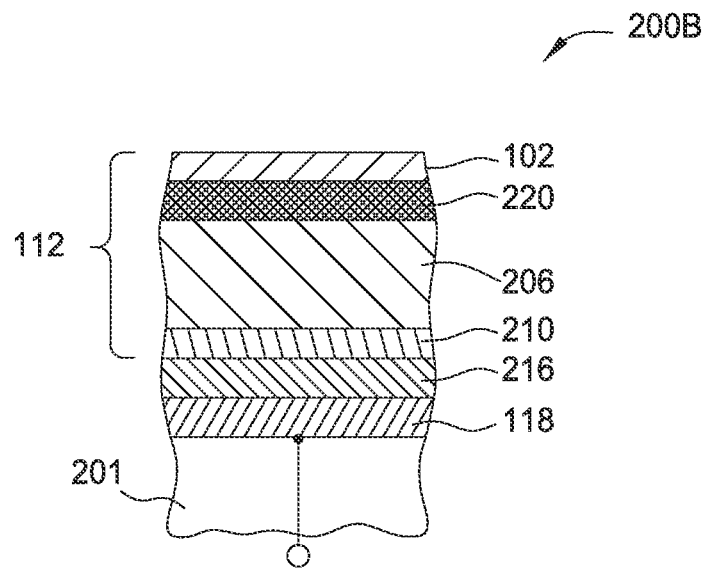
FIG. 5B is a schematic side cross-sectional view of a memory element disposed in a nonvolatile memory device in accordance with some embodiments of the invention.

In some embodiments, the embedded resistor 220 is disposed in close proximity to the resistive switching layer 206, such as substantially adjacent to the resistive switching layer 206 with an intermediate electrode 210 between the embedded resistor 220 and the resistive switching layer 206. One will note that the position of the embedded resistor 220 in the switching memory devices 200B need not be limited to the position shown in FIG. 5A, and thus the configuration as shown is not intended to be limiting as to the scope of the invention described herein. In some embodiments, the embedded resistor 220 is disposed between the resistive switching layer 206 and the current steering device 216. In some embodiments, the embedded resistor 220 can be placed between any adjacently positioned layers in the formed switching memory device 200B, such between the intermediate electrode 210 and the resistive switching layer 206 or between the intermediate electrode 210 and the current steering device 216. FIG. 5B is a schematic side cross-sectional view of an example of some embodiments of an improved switching memory device 200B as previously shown in FIG. 5A. The switching memory device 200B includes an embedded resistor 220 disposed between the resistive switching layer 206 and the top electrode 102.

Figure 5C:
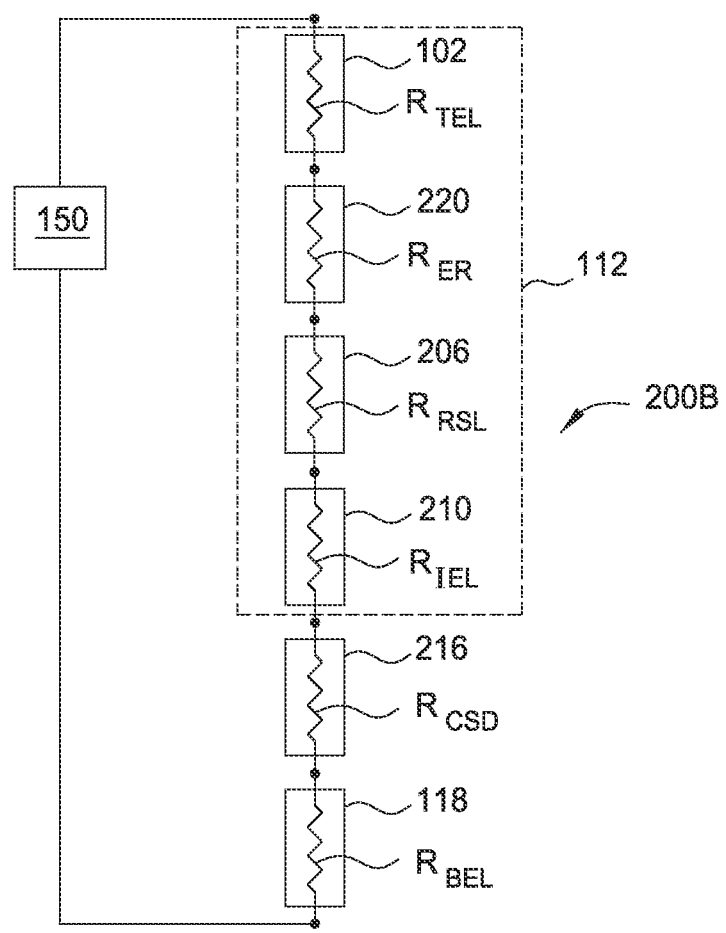
FIG. 5C is a schematic representation of an electrical circuit formed in the memory element illustrated in FIG. 5B in accordance with some embodiments of the invention.

FIG. 5C schematically illustrates an electrical circuit formed by the switching memory device 200B shown in FIG. 5B. As illustrated in FIG. 5C, the electrical circuit within the switching memory device 200B includes a top electrode impedance (i.e., resistance $R_{TEL}$) created by the top electrode 102 layer(s), an embedded resistor impedance (i.e., resistance $R_{ER}$) created by the embedded resistor 220, a resistive switching layer impedance (i.e., resistance $R_{RSL}$) created by the resistive switching layer 206, an intermediate electrode impedance (i.e., resistance $R_{IEL}$) created by the intermediate electrode 210 layer(s), a current steering device impedance (i.e., resistance $R_{CSD}$) created by the current steering device 216 and a bottom electrode impedance (i.e., resistance $R_{BEL}$) created by the bottom electrode 118 layer(s).

In some embodiments, it is desirable to form the embedded resistor 220 from a material that will not significantly vary in resistance when the "set" and "reset" switching currents are applied to the switching memory device 200B. Forming the embedded resistor 220 from a material that has a generally constant resistivity will assure that the switching characteristics of the device will not change over the operating voltage range of the device and over the life of the switching memory device 200B, due to changes in the material in the formed layer. It is desirable to form the embedded resistor 220 so that its material and electrical properties will not degrade or breakdown during the "forming" process, and also during normal repetitive operation of the switching memory device 200B.

Device Structure and Formation Processes

In one example of some embodiments, as discussed above, a memory array 100 (FIG. 1) comprises a plurality of switching memory devices 200B that are each interconnected by the electrodes 102 and 108. As illustrated in FIG. 5A, a switching memory device 200B may comprise a top electrode 102, resistive switching layer 206, an intermediate electrode 210, an embedded resistor 220, a current steering device 216, and an electrode 118. In one configuration, as noted above, the current steering device 216 comprises a p-n junction diode, p-i-n diode, transistor, or other similar device that is disposed between electrode 102 and memory element 112, or between the electrode 118 and memory element 112. In some embodiments, the current steering device 216 may include two or more layers of a semiconductor material, such as two or more doped silicon layers, that are configured to direct the flow of current through the device. In one example of some embodiments, the current steering device is a diode that comprises a p-doped silicon layer (not shown), an un-doped intrinsic layer (not shown), and an n-doped silicon layer (not shown) that has an overall resistance between about 1 kΩ and about 100 MΩ. The overall resistance will generally depend on the type of current steering device that is formed and in what direction current is flowing through the device (e.g., forward or reversed biased).

The electrodes 102, 210 and 118 disposed in the switching memory device 200B are generally formed from a conductive material that has a desirable conductivity and work function. In some embodiments, the electrode 102, 210 and/or 118 disposed in the switching memory device 200B are each formed from different materials, which may include, but are not limited to p-type polysilicon, n-type polysilicon, transition metals, transition metal alloys, transition metal nitrides, and transition metal carbides. In some embodiments, the electrode 102 and the electrode 118 comprise a metal, metal alloy, metal nitride or metal carbide formed from an element comprising one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In some embodiments, the electrodes 102 and 118 comprise a metal alloy selected from the group of a titanium/aluminum alloy, or a silicon-doped aluminum (AlSi). In some embodiments of the switching memory devices 200B, the electrodes 102 and 118 comprise a metal, such as a transition metal, transition metal alloy, transition metal carbide, transition metal nitride (e.g., TiN), non-mobile metal such as gold (Au) or platinum (Pt), and the intermediate electrode 210 comprises a heavily doped semiconductor material, such as a heavily doped silicon material (e.g., n-type polysilicon material) that interfaces well with the current steering device 216. In one some embodiments, the intermediate electrode 210 comprises polysilicon and is between about 50 Å and about 500 Å thick, and the electrodes 102 and 118 are between about 50 Å and 5000 Å thick and comprise a metal, such as titanium nitride (TiN).

The resistive switching layer 206 disposed in a switching memory device 200B can be a dielectric material, such as a metal oxide material or other similar material that can be switched between at least two or more stable resistive states. In some embodiments, the resistive switching layer 206 is a high bandgap material (e.g., bandgap >4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). It has been found that using high band gap resistive switching layer materials will improve data retention in the memory element 112, and reduce the leakage current in the formed memory element device, since the amount of trapped charge in the resistive switching layer material will be less than a lower band gap material, and the high band gap materials create a large barrier height that the carriers have to cross during the read, set and reset operations. In other embodiments, lower bandgap metal oxide materials can be used, such as titanium oxide ($TiO_x$), nickel oxide ($NiO_x$) or cerium oxide ($CeO_x$) may be advantageous for some embodiments. In some cases, a semiconductive metal oxide (p-type or n-type) such as zinc oxides ($Zn_xO_y$), copper oxides ($Cu_xO_y$), and their nonstoichiometric and doped variants can be used. The resistive switching layer 206 may comprise a metal oxide (e.g., $HfO_2$) layer formed to a thickness of between about 10 Å and about 100 Å. In some embodiments, the resistive switching layer 206 is doped with a material that has an affinity for oxygen (e.g., transition metals (Al, Ti, Zr)) to form a metal-rich resistive switching layer (e.g., $HfO_{1.7}$ vs. $HfO_2$), which is deficient in oxygen, and thus has a larger number of oxygen vacancy type defects. The additional vacancy defects can reduce the required switching and forming voltages, reduce the device operating current(s), and reduce the device to device variation in a formed memory element. In some embodiments, the resistive switching layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 Å and about 100 Å, such as between about 30 Å and about 50 Å. The resistive switching layer 206 can be deposited using any desired technique, but in some embodiments described herein is deposited using an ALD process. In some embodiments, the resistive switching layer 206 can be deposited using a CVD (e.g., LPCVD, PECVD) or ALD (e.g., PEALD), physical vapor deposition (PVD), liquid deposition processes, and epitaxy processes. It is believed that PEALD processes can be used to control defects and improve switching and forming voltages in some embodiments. In some embodiments, an ALD process using tetrakis(dimethylamino)hafnium (TDMAH) and an oxygen containing precursor at a temperature of about 250° C. is used to form an 50 Å thick hafnium oxide ($Hf_xO_y$) containing resistive switching layer 206.

In some embodiments, the embedded resistor 220 comprises a metal silicon nitride that can be reliably and consistently formed within the switching memory devices 200B. Conventional thin film resistor materials, such as tantalum nitride, tend to crystallize during high temperature annealing processes, thereby becoming conductive and resulting in the resistivity dropping well below the device specifications. It is believed that the addition of silicon to the resistor materials helps the resistor withstand crystallization so that the resistor remains in an amorphous state, which amorphous state enables the resistor to maintain the desired resistivity levels. Silicon enhances the anneal-resistant properties of the resistor, making it feasible to have an embedded resistor subject to high temperature annealing in a memory device.

To achieve an embedded resistor 220 that has desirable electrical and/or physical properties, the embedded resistor should be formed from a metal silicon nitride material. One skilled in the art will appreciate that the resistance (R) to current flow through the embedded resistor 220 can be adjusted by varying the thickness, material composition, or morphology, such as a crystalline or an amorphous structure. Since the cross-sectional area (A) of the device is generally fixed by the size and lateral spacing of the switching memory devices 200B, and thus is generally not easily varied from one switching memory device to the next, the resistance R of the embedded resistor 220 can be controlled by the adjustment of the thickness of embedded resistor 220. In some embodiments, the thickness of the embedded resistor 220 is from between 50 Å and about 500 Å thick, such as about 100 Å thick, while the surface area of the embedded resistor is from between about 40 $nm^2$ and 50 $nm^2$, such as about 45 $nm^2$.

In some embodiments of the memory element 112, the formed embedded resistor 220 provides a resistivity that is substantially constant over a voltage range from about 8 megavolts/centimeter and below, such as from between about 4 MV/cm to about 8 MV/cm. In some embodiments, the resistivity over that range is between about 1 ohm-cm to about 4 ohm-cm. Embodiments provide a resistor having a resistivity that remains constant over a large voltage range. The resistivity of most materials degrades as the operating voltage increases. Unlike most materials, the resistivity of an embedded resistor formed according to some embodiments degrades by no more than one order of magnitude as the device voltage increases from 0 MV/cm to 8 MV/cm.

The embedded resistor 220 also has a normalized total resistance value from about 90 kilo ohms (kΩ) to about 210 kilo ohms (kΩ), such as about 100 kilo ohms (kΩ). The embedded resistor 220 may be scaled to reduce its area or thickness while still providing the targeted normalized resistance value. Thus, the embodiments enable increasing the resistivity while reducing resistor area and size, thereby providing future flexibility for manufacturing processes and designs to further scale nonvolatile memory devices without requiring new material investigation or significant processing alterations.

The embedded resistor 220 may be formed using a PVD, CVD or ALD type process. In an example of some embodiments of a PVD process, the PVD target may be a metal silicide that is sputtered in a nitrogen-containing ambient. Thus, the embedded resistor 220 may be formed from a metal silicon nitride material. Alternatively, the embedded resistor may be formed as a metal nitride material followed by silicon doping of the metal nitride via implantation, injection, or other doping means in order to provide silicon to the metal nitride embedded resistor. Thus, the embedded resistor may also comprise a silicon-doped metal nitride material.

Materials used to form the embedded resistor 220 include various metal silicon nitrides. In some embodiments, the embedded resistor materials should not be an oxygen-scavenging compound that could potentially degrade ReRAM performance. For example, in some embodiments the embedded resistor 220 may comprise ternary or quaternary compounds of silicon doped metal nitride. The metal may be selected from columns 4 through 7 of the periodic table of elements. In some embodiments, the metal or metals comprise one or more of zirconium (Zr), vanadium (V), niobium (Nb), chromium (Cr), aluminum, (Al), hafnium (Hf), tantalum (Ta), titanium (Ti), tungsten (W), and molybdenum (Mo). Some examples of suitable ternary compounds include $Hf_xSi_yN_z$, $Ta_xSi_yN_z$, $Ti_xSi_yN_z$, $W_xSi_yN_z$, and $Mo_xSi_yN_z$. An example of a suitable quaternary compound is $Hf_aTa_bSi_yN_z$ where a+b=x. The specific amount of silicon in the embedded resistor 220 may vary, depending on the desired final resistor physical and electrical characteristics and other metals used. The amount of silicon in the metal silicon nitride embedded resistor 220 may be in the range from about 0.1 atomic (at %) to about 75.0 at %, such as between about 5 at % to about 40 at %. It is believed that the addition of silicon helps the material retain an amorphous state and disrupts conduction, which results in increased scattering and thus a high resistance.

It is generally desirable to form the embedded resistor 220 so that its material and electrical properties will not degrade or breakdown during the often high temperature device preparation steps, and also during normal repetitive operation of the nonvolatile resistive switching memory device. The silicon in the embedded resistor materials helps stabilize the compound by keeping the film amorphous and preserving and/or enhancing the annealed resistance properties of the film, thereby rendering a metal silicon nitride resistor feasible as an embedded resistor in nonvolatile memory devices. The metal silicon nitride film has an increased robustness that can withstand the high-temperature annealing processes required for diode (current steering device 216) activation without significant loss of resistivity levels.

Typical deposition processes may include ALD, PVD and CVD processes that can be tailored to adjust the electrical properties and thickness of the deposited embedded resistor 220. In some embodiments, for a memory element 112 that is about 45 nm×45 nm in size, a embedded resistor 220 that is about 100 Å thick, and has an equivalent resistivity of 2.0 Ω-cm will achieve a resistance of about 100 kΩ, so as to control the resulting (programmed) resistance of the resistive switching layer, and to optimize the total stack between leakage (reduced with increased resistance) and programming difficulty (increased with increased resistance). It is believed that the resistive switching layer's programmed resistance correlates with the resistance of the embedded resistor 220. Thus, for the resistive switching layer to have a programmed resistance of 100 kΩ, an embedded resistor with a similar value is needed. In another example of some embodiments, the embedded resistor 220 is formed so that its impedance ($R_{ER}$) is between about 90 kΩ and about 210 kΩ, such as between about 90 kΩ and about 110 kΩ.

Switching Memory Device Fabrication Processes

Figure 6:
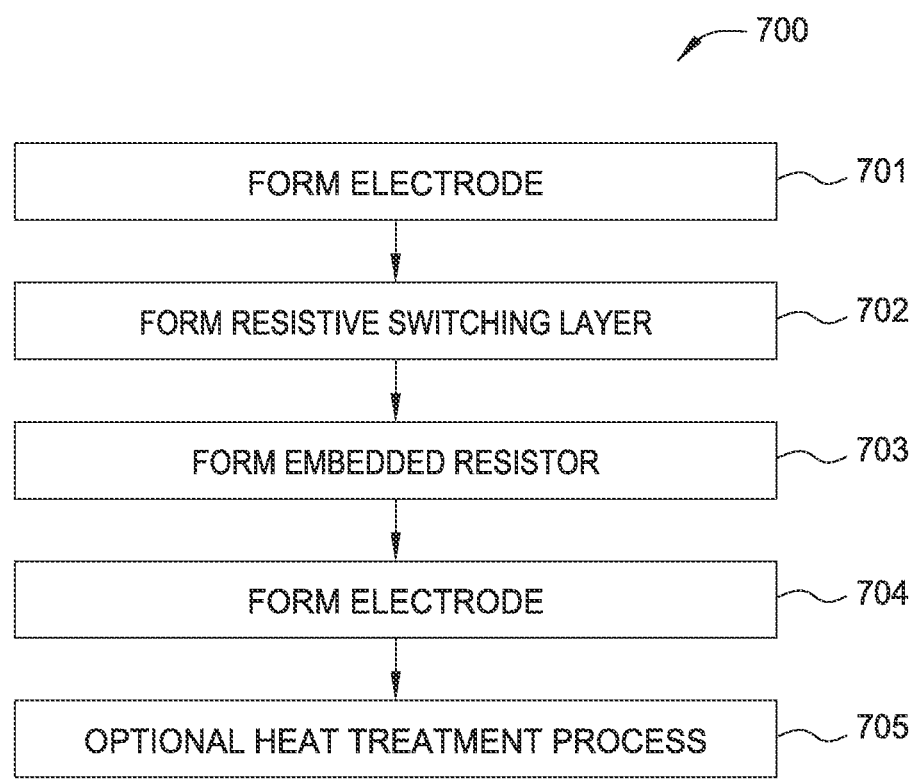
FIG. 6 is a schematic depiction of a process for forming the switching memory device according to some embodiments of the invention.

FIG. 6 illustrates a process sequence 700 that can be used to form a memory element 112 components in a switching memory device 200B illustrated in FIGS. 5A & 5B, according to some embodiments. While omitted from the discussion below, the electrode 118 and current steering device 216 elements can be formed over a portion of a substrate 201, such as a silicon substrate, by use of a physical vapor deposition (PVD), chemical vapor deposition (CVD), atomic layer deposition (ALD), or other similar process that is well known in the art. In some embodiments, the current steering device 216 is a diode that comprises a p-doped silicon layer (not shown) that is formed by a CVD process, an un-doped intrinsic layer (not shown) that is formed by a CVD process, and an n-doped silicon layer (not shown) that is formed by a CVD process. In some embodiments, the electrode 118 comprises a layer of titanium nitride (TiN) that is between about 500 Å and 1 μm thick and is formed by use of a PVD process.

Referring to FIGS. 5B and 6, at step 701 an intermediate electrode 210 is formed over a substrate 201. In some embodiments, the intermediate electrode 210 is a highly doped polysilicon layer that is formed using a conventional CVD or ALD type polysilicon deposition technique. In some embodiments, an optional native oxide layer removal step may be performed after forming the intermediate electrode layer 210 by use of a wet chemical processing technique, or conventional dry clean process that is performed in a plasma processing chamber. In some embodiments, the intermediate electrode 210 comprises polysilicon that is between about 50 Å and about 5000 Å thick, which is formed by use of a CVD or ALD polysilicon deposition process.

Referring to FIGS. 5B and 6, at step 702, the resistive switching layer 206 is deposited over the intermediate electrode 210 using a PVD, CVD or ALD deposition process. The resistive switching layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 Å and about 100 Å, such as between about 30 Å and about 50 Å. The resistive switching layer 206 can be deposited using any desired technique, but in some embodiments described herein is deposited using an ALD process. In some embodiments, an ALD process using tetrakis(dimethylamino)hafnium (TDMAH) and an oxygen containing precursor (e.g., water vapor) at a temperature of about 250° C. is used to form a 30 Å thick hafnium oxide ($Hf_xO_y$) which acts as the resistive switching layer 206.

At step 703, as depicted in FIGS. 5B and 6, an embedded resistor 220 is formed over the resistive switching layer 206 as shown in FIG. 5B. In some embodiments, the embedded resistor includes a silicon rich metal nitride material such as titanium silicon nitride ($Ti_xSi_yN_z$) or tantalum silicon nitride ($Ta_xSi_yN_z$). The embedded resistor 220 may be deposited using a deposition process, such as PVD, CVD, ALD or other similar process. In some embodiments, the embedded resistor is between about 50 Å and 500 Å thick. In some embodiments, a PVD process is used to form an embedded resistor 220 that comprises tantalum silicon nitride ($Ta_xSi_yN_z$) that is about 100 Å thick.

In some embodiments, the embedded resistor 220 comprises a tantalum silicon nitride ($Ta_xSi_yN_z$) layer that is formed using a PVD process. The ratio of x:y may be anywhere from 1:1 to 1:3, such as 1:3, and z=0.4 to 0.8, such as 0.5. The PVD target may comprise a tantalum-silicon material that is sputtered with plasma in a nitrogen-containing atmosphere. In this example of some embodiments, the desired film composition of $Ta_xSi_yN_z$ is nitrogen dependent and somewhat silicon independent. It is believed that changing the nitrogen atmosphere from a 20% nitrogen-containing composition to 50% nitrogen-containing composition will provide a tantalum silicon nitride layer having an increased resistivity. Increasing the amount of nitrogen-containing gas in the PVD ambient may produce a wide range of properties and resistivities in the resistor 220.

In some embodiments, the embedded resistor 220 comprises a titanium silicon nitride ($Ti_xSi_yN_z$) layer that is also formed using a PVD process. The PVD target may comprise a titanium-silicon material that is sputtered with plasma in a nitrogen-containing atmosphere. In this embodiment, the process and thus the final film composition tends to be nitrogen independent yet silicon dependent. Unlike TaSiN where the resistivity changes more with nitrogen than with the metal to silicon ratio, this system shows that the Ti:Si ratio strongly determines resistivity. It is believed that increasing the amount of silicon in the target compared to the titanium makes the film formed on the substrate silicon rich. In this embodiment, the ratio of x:y may be 1:2 or 2:1. In other words, x≈y, x>y, or x<y. The amount of z=0.4 to 0.8, such as 0.5.

At step 704, the electrode 102 is formed over the embedded resistor 220 as shown in FIG. 5B using one or more of the materials that are discussed above. The electrode 102 layer may be deposited using a deposition process, such as a PVD, CVD, ALD or other similar process. In some embodiments, the electrode 102 layer is between about 100 Å and 1000 Å thick. In some embodiments, a PVD process is used to form an electrode 102 layer that comprises titanium nitride (TiN) and is between about 100 Å and 1000 Å thick.

At step 705, the formed switching memory device 200B is optionally annealed at a temperature of greater than about 700° C. In some embodiments, the formed switching memory device 200B is annealed at a temperature from about 700° C. to about 900° C. for a period of time between about 30 seconds and about 90 seconds. In some embodiments, the memory device 200B may be annealed for 750° C. for 60 seconds. The embedded resistor is formed from metal silicon nitride materials in order to withstand the high temperature annealing process(es) while retaining its desired electrical and physical properties, including remaining substantially amorphous. The process(es) performed at step 705, are generally configured to cause the layers disposed in the switching memory device 200B to form a desirable interface between adjacent layers as well as activate and/or desirably process the other layers formed in the switching memory device.

Process and Device Examples

In an example of some embodiments of a process of forming a switching memory device, after performing the steps 701-705 in the processing sequence 700, a memory element 112 is formed that comprises: an intermediate electrode 210 comprising an n-doped polysilicon layer, a resistive switching layer 206 that is about 50 Å thick and comprises hafnium oxide (HfO$_x$), an embedded resistor 220 that is about 100 Å thick, and comprises tantalum silicon nitride (Ta$_x$Si$_y$N$_z$) where x=1, y=3, and z=3, and an electrode 102 that comprises a layer of titanium nitride (TiN). The embedded resistor 220 is formed in a nitrogen atmosphere having an N$_2$ concentration of 30%. After forming the switching memory device 200B (FIG. 5B), at least one thermal processing step is performed, such as step 705, to form switching memory device 200B. The electrical properties of the embedded resistor were measured after the thermal processing step. In this example, the resistivity and resistance of the embedded resistor measured about 2.0 Ω-cm and about 108 kΩ, respectively.

In an example of some embodiments of a process of forming a switching memory device, after performing the steps 701-705, a memory element 112 is formed that comprises an intermediate electrode 210 comprising an n-doped polysilicon layer, a resistive switching layer 206 that is about 50 Å thick and comprises hafnium oxide (HfO$_x$), an embedded resistor 220 that is about 100 Å thick, and comprise tantalum silicon nitride (Ta$_x$Si$_y$N$_z$) where x=1, y=2, and z=3, and an electrode 102 that comprises a layer of titanium nitride (TiN). The embedded resistor 220 is formed in a nitrogen atmosphere having an N$_2$ concentration of 25%. After forming the switching memory device 200B, at least one thermal processing step is performed, such as step 705, to form switching memory device 200B. The electrical properties of the embedded resistor were measured after the thermal processing step. In this example, the resistivity and resistance of the embedded resistor measured about 2.0 Ω-cm and about 108 kΩ, respectively.

The foregoing is merely illustrative of the principles of this invention and various modifications can be made by those skilled in the art without departing from the scope and spirit of the invention as defined by the claims that follow.

The invention claimed is:

1. A nonvolatile resistive random access memory device, comprising:
   a diode;
   a metal silicon nitride embedded resistor; and
   a resistive switching layer disposed between a first electrode layer and a second electrode layer;
   wherein the metal silicon nitride comprises one or more elements from columns 4 through 7 of the periodic table.

2. The memory device of claim 1, wherein the embedded resistor has a resistivity within a range from 1 to 4 ohm-cm.

3. The memory device of claim 2, wherein the resistivity of the embedded resistor is substantially constant over a voltage range from 4 MV/cm to 8 MV/cm.

4. The memory device of claim 1, wherein the embedded resistor has a resistance within a range from 90 kΩ to 210 kΩ.

5. The memory device of claim 1, wherein the embedded resistor has a thickness between 50 angstroms and 500 angstroms (Å).

6. The memory device of claim 1, wherein the embedded resistor comprises an amorphous material.

7. The memory device of claim 6, wherein the embedded resistor remains substantially amorphous after being annealed at 750° C. for 60 seconds.

8. The memory device of claim 1, wherein the embedded resistor comprises a ternary or quaternary compound of metal silicon nitride.

9. The memory device of claim 1, wherein the metal silicon nitride comprises one or more of zirconium (Zr), vanadium (V), niobium (Nb), chromium (Cr), aluminum, (Al), hafnium (Hf), tantalum (Ta), titanium (Ti), tungsten (W), and molybdenum (Mo).

10. The memory device of claim 8, wherein the ternary compound of said ternary or quaternary compound of metal silicon nitride comprises one or more of Hf$_x$Si$_y$N$_z$, Ta$_x$Si$_y$N$_z$, Ti$_x$Si$_y$N$_z$, W$_x$Si$_y$N$_z$, and Mo$_x$Si$_y$N$_z$.

11. The memory device of claim 8, wherein the quaternary compound of said ternary or quaternary compound of metal silicon nitride is Hf$_a$Ta$_b$Si$_y$N$_z$ where a+b=x.

12. The memory device of claim 1, wherein the metal silicon nitride of said resistor comprises silicon in a range from 0.1 at % to 75.0 at %.

13. A method of forming a resistive random access memory device, the method comprising:
   forming a diode;
   forming a metal silicon nitride embedded resistor;
   forming a first electrode layer;
   forming a second electrode layer;
   forming a resistive switching layer disposed between the first electrode layer and the second electrode layer; and
   annealing the memory device at 750° C. for 60 seconds after forming the second electrode layer.

14. The method of claim 13, wherein forming the embedded resistor comprises a PVD, CVD, or ALD process.

15. The method of claim 13, wherein the embedded resistor has a resistance of 90 kΩ to 210 kΩ and a resistivity within a range from 1 to 4 ohm-cm.

16. The memory device of claim 15, wherein the resistivity of the embedded resistor is substantially constant over a voltage range from 4 MV/cm to 8 MV/cm.

17. The memory device of claim 13, wherein the embedded resistor comprises a ternary or quaternary compound of metal silicon nitride and wherein the metal silicon nitride comprises one or more elements from columns 4 through 7 of the periodic table.

18. The memory device of claim 13, wherein the metal silicon nitride comprises silicon in a range from 0.1 at % to 75.0 at %.

* * * * *